United States Patent
Ye et al.

(10) Patent No.: US 11,741,272 B2
(45) Date of Patent: *Aug. 29, 2023

(54) INTERPRETER FRAMEWORK FOR A COMPUTER FILE

(71) Applicant: Nuvolo Technologies Corporation, Paramus, NJ (US)

(72) Inventors: Tao Ye, Garfield, NJ (US); Tejas Yadav, West Haven, CT (US); Asim Rizvi, Howell, NJ (US)

(73) Assignee: Nuvolo Technologies Corporation, Paramus, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/855,509

(22) Filed: Jun. 30, 2022

(65) Prior Publication Data
US 2022/0335174 A1 Oct. 20, 2022

Related U.S. Application Data

(63) Continuation of application No. 17/008,029, filed on Aug. 31, 2020, now Pat. No. 11,514,205, which is a
(Continued)

(51) Int. Cl.
*G06F 8/51* (2018.01)
*G06F 30/13* (2020.01)
(Continued)

(52) U.S. Cl.
CPC .............. *G06F 30/13* (2020.01); *G06F 8/427* (2013.01); *G06F 8/51* (2013.01); *G06F 8/75* (2013.01);
(Continued)

(58) Field of Classification Search
CPC ..... G06F 8/51; G06F 8/61; G06F 8/65; G06F 8/75; G06F 16/29; G06F 16/2455
See application file for complete search history.

(56) References Cited

U.S. PATENT DOCUMENTS 7,542,886 B2 6/2009 Storms et al.
7,869,981 B2 1/2011 Pendyala et al.
(Continued)

OTHER PUBLICATIONS

Stack Exchange (Sep. 11, 2015) "How to Extract Style Data from DXF when Converting to GeoJSON", 3 pages.

*Primary Examiner* — Duy Khuong T Nguyen
(74) *Attorney, Agent, or Firm* — Mintz Levin Cohn Ferris Glovsky and Popeo, P.C.

(57) ABSTRACT

A method for an interpreter framework is described. The method includes an interpreter module of a computing system receiving a first data file that includes multiple data sections. The interpreter module identifies each of the data sections of the first data file. Each data section includes data representing a real-world entity. For each respective data section of the first data file, the interpreter module parses information about the real-world entity represented by the data included in the data section. The interpreter module generates a second data file based on the parsed information for each of the data sections. The second data file includes encoded data for rendering a digital geographic structure using information about the real-world entity.

19 Claims, 5 Drawing Sheets

Related U.S. Application Data continuation of application No. 16/166,885, filed on Oct. 22, 2018, now Pat. No. 10,762,250.

(60) Provisional application No. 62/614,857, filed on Jan. 8, 2018, provisional application No. 62/614,870, filed on Jan. 8, 2018.

(51) Int. Cl.
*G06F 16/29* (2019.01)
*G06F 16/2455* (2019.01)
*G06F 30/00* (2020.01)
*G06F 8/41* (2018.01)
*G06F 8/75* (2018.01)

(52) U.S. Cl.
CPC .......... *G06F 16/2455* (2019.01); *G06F 16/29* (2019.01); *G06F 30/00* (2020.01)

(56) References Cited

U.S. PATENT DOCUMENTS

| | | |
|---|---|---|
| 8,484,556 B2 | 7/2013 | Mcmillan et al. |
| 8,577,905 B2 * | 11/2013 | Gan .................. G06F 16/29 707/756 |
| 9,177,418 B1 | 11/2015 | Bawden et al. |
| 9,275,173 B2 | 3/2016 | Loomis et al. |
| 9,384,308 B2 | 7/2016 | Snyder et al. |
| 9,459,600 B2 | 10/2016 | Huffine |
| 10,628,616 B2 | 4/2020 | Yadav et al. |
| 10,762,250 B2 | 9/2020 | Ye et al. |
| 11,222,148 B2 | 1/2022 | Yadav et al. |
| 2002/0188622 A1 | 12/2002 | Wallen et al. |
| 2004/0153824 A1 | 8/2004 | Devarajan et al. |
| 2005/0071135 A1 | 3/2005 | Vredenburgh et al. |
| 2005/0081161 A1 | 4/2005 | Macinnes et al. |
| 2006/0041842 A1 | 2/2006 | Loberg |
| 2008/0125892 A1 | 5/2008 | Hoguet |
| 2010/0268513 A1 | 10/2010 | Loberg |
| 2011/0087662 A1 * | 4/2011 | Darby, Jr. .............. G06Q 50/08 707/812 |
| 2012/0290429 A1 | 11/2012 | Ostroff |
| 2016/0140771 A1 | 5/2016 | Chang et al. |
| 2017/0092012 A1 | 3/2017 | Palanivelu et al. |
| 2019/0057110 A1 | 2/2019 | Albrecht et al. |
| 2019/0212991 A1 | 7/2019 | Ye et al. |
| 2019/0213287 A1 | 7/2019 | Ye et al. |
| 2020/0334392 A1 | 10/2020 | Yadav et al. |
| 2020/0394344 A1 | 12/2020 | Ye et al. |
| 2022/0171895 A1 | 6/2022 | Yadav et al. |

* cited by examiner

INTERPRETER FRAMEWORK FOR A COMPUTER FILE

CROSS-REFERENCE TO RELATED APPLICATION

This application is a continuation and claims priority to U.S. application Ser. No. 17/008,029 filed on Aug. 31, 2020 and entitled "INTERPRETER FRAMEWORK FOR A COMPUTER FILE," which is a continuation of U.S. application Ser. No. 16/166,885 filed on Oct. 22, 2018 and entitled "INTERPRETER FRAMEWORK FOR A COMPUTER FILE," which claims the benefit of U.S. Provisional Application 62/614,857 filed on Jan. 8, 2018 and entitled "INTERPRETER FRAMEWORK FOR A COMPUTER FILE" and claims the benefit of U.S. Provisional Application 62/614,870 filed on Jan. 8, 2018 and entitled "SPACE PROFILE INTERPRETER FRAMEWORK FOR A COMPUTER FILE," the disclosures of which are incorporated by reference herein in their entirety.

This application is related to U.S. Patent Application No. 62/614,870, entitled "SPACE PROFILE INTERPRETER FRAMEWORK FOR A COMPUTER FILE," filed on Jan. 8, 2018, and Attorney Docket Number 45263-0010P01. The entire disclosure of U.S. Patent Application No. 62/614,870 is expressly incorporated by reference herein in its entirety.

BACKGROUND

This application relates to computing processes for converting electronic files.

DXF files are generated by a computer-aided design (CAD) program (e.g., commercial CAD programs or drafting software applications) and encode data representations of real-world constructs. For example, the data representations can be two dimensional floorplans for a building, where the floorplans include different outlines for each room of a floor. Data representations of real-world constructs in separate DXF files can be encoded and arranged differently based on preferences and design choices used in the CAD program. Because data representations can be encoded in DXF files in a variety of ways, interpreting DXF files can be challenging.

SUMMARY

A DXF drawing file can be converted to a GeoJSON file by parsing and extracting data from sections of the DXF drawing file. The extracted data is converted to GeoJSON format and aggregated to create a GeoJSON file for viewing and modifying representations of real-world constructs. A computer application can interpret DXF files irrespective of the different ways in which data defining the representations is arranged within the files. For example, the computer application incorporates a standard method for identifying certain sections of the DXF files, extracting relevant information from the sections, converting the extracted information, and aggregating or rendering the information to produce the GeoJSON file.

One aspect of the subject matter described in this specification can be embodied in a computer-implemented method. The method includes, receiving, at an interpreter module of a computing system, a first electronic data file comprising multiple respective data sections; identifying, by the interpreter module, each of the respective data sections of the first electronic data file, each data section comprising data representing a real-world entity of the first electronic data file. For each of the respective data sections, the method includes, parsing, by the interpreter module, information about the real-world entity represented by the data included in the data section. The method further includes, generating, by the interpreter module and based on each of the respective data sections, a second electronic data file comprising encoded data for rendering at least one digital geographic structure using information about the real-world entity represented by the data included in the data section.

These and other implementations can each optionally include one or more of the following features. For example, in some implementations, parsing the information about the real-world entity includes: extracting dimensional coordinates for the real-world entity, the dimensional coordinates defining characteristics of the real-world entity; and in response to extracting, digitally rendering the at least one geographic structure using the dimensional coordinates.

In some implementations, generating the second electronic data file includes: converting, to a geospatial data format, the extracted dimensional coordinates for the real-world entity, wherein the geospatial data format includes at least one dataset comprising geometry or physical attribute information about the real-world entity; translating the digital geographic structure by aggregating the converted dimensional coordinates that have the geospatial data format; and generating the second electronic data file based on the rendered digital geographic structure.

In some implementations, the information about the real-world entity represented by the data included in each of the respective data sections at least one of: i) defines an outline of the real-world entity, or ii) is descriptive of the real-world entity. In some implementations, the first electronic data file defines multiple layers, each layer representing a feature of a digitally rendered geographic structure; and each of the respective data sections corresponds to a particular layer of the multiple layers defined by the first electronic file.

In some implementations, the real-world entity defines a virtual boundary of the feature of the digitally rendered geographic structure, and the layer corresponds to a floorplan of a physical space renderable as a digital geographic structure and the feature corresponds to a shape of at least a portion of the floorplan. In some implementations, the interpreter module is configured to communicate with an enterprise system that manages one or more assets and the method further includes: associating, by a mapping module of the computing system, at least one asset managed by the enterprise system with at least one feature of the digitally rendered geographic structure based on a location hierarchy for the geographic structure.

In some implementations, the first electronic data file: i) is a drawing file generated by a particular application program; ii) includes data for encoding one or more graphical objects; and ii) that has a first file format for enabling interoperability between the drawing file generated by the particular application program and one or more other application programs. In some implementations, the particular application program is a computer-aided design (CAD) application program; and the first file format corresponds to a drawing exchange format (DXF).

In some implementations, the second electronic data file has a second file format that corresponds to a geospatial data interchange format for encoding one or more geographic data structures. In some implementations, the second electronic data file comprises encoded data for rendering multiple respective digital geographic structures, and each respective digital geographic structure corresponds to a particular real-world entity of multiple real-world entities represented by the data included in the data section.

Other implementations of this and other aspects include corresponding systems, apparatus, and computer programs, configured to perform the actions of the methods, encoded on computer storage devices. A computing system of one or more computers or hardware circuits can be so configured by virtue of software, firmware, hardware, or a combination of them installed on the system that in operation cause the system to perform the actions. One or more computer programs can be so configured by virtue of having instructions that, when executed by a data processing apparatus, cause the apparatus to perform the actions.

The subject matter described in this specification can be implemented to realize one or more of the following advantages. DXF files can be interpreted irrespective of the different ways in which data is arranged within the files. The described standardized framework can be implemented to efficiently identify sections of DXF files, parse entity data for the sections, and to extract relevant entity records from the sections. Processes are described for extracting coordinate data of the entity records and converting the extracted data from a raw DXF drawing file format to a GeoJSON geospatial data file format.

The details of one or more implementations of the subject matter described in this specification are set forth in the accompanying drawings and the description below. Other potential features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
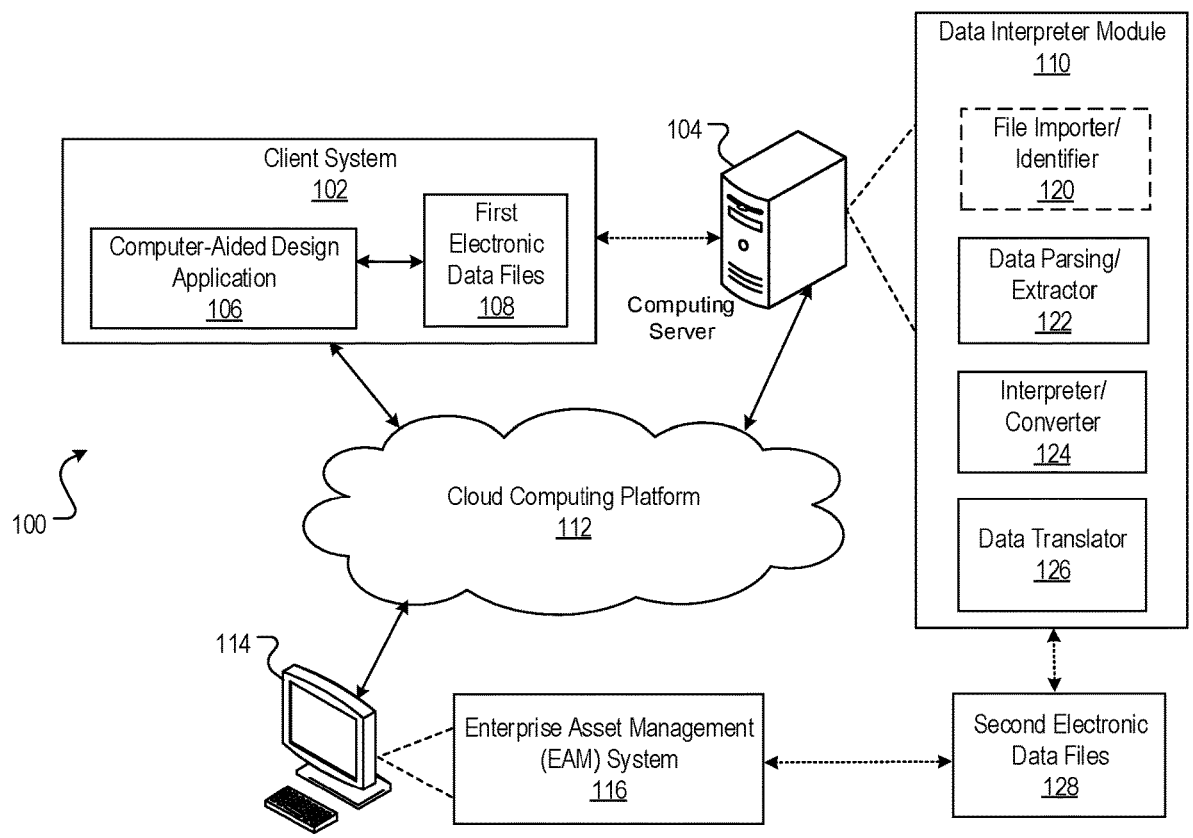
FIG. 1 illustrates an example computing system for executing an interpreter framework to convert one or more files.

This document describes techniques for interpreting DXF files irrespective of the different data arrangements within the files. For example, the described techniques include a file interpreter framework for converting DXF files to GeoJSON files. Drawing files that have a DXF file format are often formatted to include multiple data sections. The described interpreter framework can be represented by a computer application that receives the drawing file and uses an interpreter module of the computer application to identify the different data sections of the drawing file. For example, the drawing file may be used to view renderings of a building floorplan and each data section of the file can include information about a layer of the floorplan. A layer of a floorplan can correspond to electrical lines of the floorplan or plumbing lines of the floorplan.

Each data section can include objects that contain information about the section. For example, objects can be entity records containing graphical information defining shapes and outlines of objects in the floorplan. The computer application parses and extracts object information of the drawing file and converts the extracted object information to a renderable format. For example, the application can convert extracted dimensional coordinates of a DXF file to a geoJSON format for rendering geographic data structures. The application program then generates a geoJSON file that can be used to graphically render the floorplan of the DXF file.

The DXF file format provides a file structure that includes the following types of data sections: i) a HEADER section that includes general information about the drawing; ii) a CLASSES section that holds the information for application-defined classes; iii) a TABLES section that contains definitions of named items; iv) a BLOCKS section that contains Block Definition entities describing the entities in the drawing; v) an ENTITIES section that contains the drawing entities, including any Block section references; vi) an OBJECTS section that contains data that applies to non-graphical objects; and vii) a THUMBNAILIMAGE section that contains the preview image for the DXF file.

The GeoJSON file format is a format for encoding a variety of geographic data structures (e.g., encoded data). In general, the GeoJSON file format is a geospatial data interchange format based on JavaScript Object Notation (JSON) and is designed for representing geographical features, along with their non-spatial attributes. An object of a GeoJSON file may represent a geometry, a feature, or a collection of features. The features can include points (e.g., addresses and locations), line strings (e.g., streets, highways and boundaries), polygons (e.g., countries, provinces, tracts of land), and multi-part collections of these types. In some implementations, GeoJSON features can represent non-physical real-world entities. For example, mobile routing and navigation applications might describe signal coverage areas using the GeoJSON format.

As used in this document, the interpreter framework can represent a specific set of computer-implemented rules for a standardized method of converting a DXF file to a geoJSON file. The interpreter framework enables the automation of specific computer-related DXF file interpretation and conversion tasks that previously could not be performed by computer systems in an efficient manner. The framework improves computer-based file conversion processes by enabling different arrangements of data representations in a DXF file to be automatically converted and rendered for viewing in a geoJSON format. Also, the described techniques provide a repeatable automated process that involves minimal human intervention and does not require manual execution of data parsing, extraction, or conversion functions. As such, the techniques enable computing systems to perform operations that the systems were previously unable to automatically perform due to the challenges of developing standardized methods for interpreting DXF files.

FIG. 1 illustrates an example computing system 100 for executing an interpreter framework to convert one or more files. The system 100 generally includes a client system 102, a computing server 104, a cloud computing platform 112, a client device 114, and an enterprise asset management (EAM) system 116. EAM is the management of the physical (and virtual) assets of an organization or business enterprise. Asset management can cover concepts including the design, construction, commissioning, operations, maintenance, decommissioning, or replacement of assets such as electronic devices, mechanical equipment, or facilities. An example EAM system can execute software programs that provide asset managers with computer-based options for holistically viewing and managing a variety of different company-owned resources.

In general, the platform 112 can correspond to an example cloud-based computing system. For example, the platform 112 can enable access to certain application programs and code scripts for performing various data processing operations. In addition, the platform 112 can facilitate or enable the sharing of data communications between client and server devices of system 100.

The client system 102 can generally include one or more client devices 114. Any of the client devices 114 can be a desktop computer, a laptop computer, a tablet device, a smart computer device, or one of other related electronic devices that are configured to execute example design application programs. The client system 102 executes a computer-aided design application 106 for generating one or more electronic data files 108. In some implementations, the application 106 is an example computer-aided design (CAD) program (e.g., commercial CAD programs or drafting software applications) and the electronic data files 108 are DXF files generated by the CAD program. As described in further detail below, the DXF files are drawing files that encode data representations of real-world constructs.

The computing server 104 includes a data interpreter module 110 and is generally configured to exchange data, including electronic data files, with the client system 102. The server 104 is configured to access, implement, and/or execute the data interpreter module 110. For example, the server 104 can obtain or receive one or more data files 108 from the client system 102. As described in more detail below, the server 104 can cause the interpreter module 110 to execute specific computing processes for an interpreter framework. Using the interpreter module 110, the server 104 can convert a first data file 108 in order to generate a corresponding new second data file 128. For example, the server 104 uses the interpreter module 104 to execute specific computing rules to interpret and convert data files 108 in order to generate the new data files 128. The new second data files 128 may have file characteristics that are different than file characteristics of the first data files 108.

For example, a data file 108 can be a drawing file generated by a particular type of application 106 (e.g., a CAD program) and can include data for encoding one or more graphical objects. The data files 108 can have a file format for enabling interoperability between drawing files generated by the application 106 and one or more other application programs. In particular, the file format can be a drawing exchange format (DXF) which indicates file characteristics of the data files 108. Using processes described in this document, a user can leverage the interoperability afforded by the DXF file format to interpret and convert a data file 108, e.g., a DXF drawing file, to generate a corresponding data file 128. The data file 128 has a geospatial data interchange format, e.g., GeoJSON format, for encoding one or more geographic data structures.

While in typical implementations, the interpreter module 110 is encoded on computer-readable media, in some implementations, the interpreter module 110 is included within the server 104 as a sub-system of hardware circuits that includes one or more processing devices or processor microchips. In general, the server 104 can include processors, memory, and data storage devices that collectively form modules and computer systems of the server 104. Processors of the computer systems process instructions for execution by the server 104, including instructions stored in the memory or on the data storage device to display graphical information for output at an example display monitor of system 100.

Execution of the stored instructions can cause one or more of the actions described herein to be performed by the server 104 or the interpreter module 110. In other implementations, multiple processors may be used, as appropriate, along with multiple memories and types of memory. For example, the server 104 may be connected with multiple other computing devices, with each device (e.g., a server bank, groups of servers, modules, or a multi-processor system) performing portions of the actions, operations, or logical flows described in this specification.

The data interpreter module 110 executes a file interpreter framework for converting DXF files to GeoJSON files. The data interpreter module 110 processes programed instructions for executing a file importer 120, a data extractor 122, a data converter 124, and a data translator 126. As described in more detail below with reference to FIG. 2, the module 110 uses the importer 120 to receive or obtain the data file 108 from the client system 102. The data file 108 can be a DXF drawing file that is formatted to include multiple data sections. Using the programmed instructions, the data interpreter module 110 executes a file interpreter framework for converting DXF files to GeoJSON files.

For example, a DXF drawing file can be converted to a GeoJSON file by using importer 120 to receive and identify certain sections of the DXF file and then using data extractor 122 to parse and extract data from the identified sections of the DXF drawing file. Converter 124 interprets the extracted data and uses coded scripts to convert the data to a GeoJSON format. The data translator 126 is used to process and aggregate the converted data in order to create a GeoJSON file which corresponds to data file 128. The data file 128 can be a GeoJSON file that is used by the EAM system 116 to view and modify existing representations of real-world constructs. In some implementations, the client device 114 is used to interface with the EAM system 116 to manage existing location hierarchies or to create new hierarchies based on information included in the GeoJSON data files 128.

Figure 2:
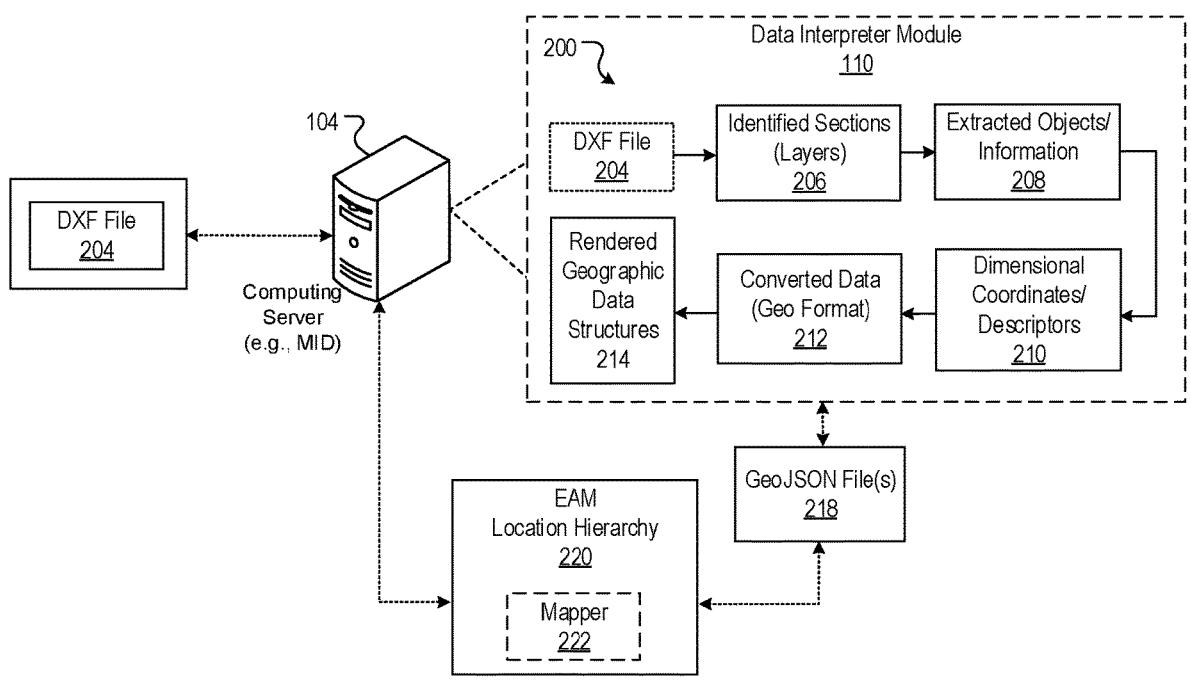
FIG. 2 illustrates an interpreter module of the example computing system of FIG. 1.

FIG. 2 illustrates the interpreter module 110 of the computing system 100 described above with reference to FIG. 1. In particular, FIG. 2 shows an interpreter framework 200 used by the interpreter module 110 to convert a DXF file 204 to a GeoJSON file 218. Framework 200 includes the interpreter module 110 receiving a DXF drawing file 204. The interpreter module 110 imports or receives file 204 using the server 104. In some implementations, the server 104 uses computing services enabled by the cloud computing platform 112 to access the file 204 from the client system 102 and to access the interpreter module 110.

For example, the interpreter module 110 can reside on a software service device of the cloud computing platform 112 and use the platform 112 to import the file 204. In some implementations, the cloud computing platform 112 is a ServiceNow platform. In other implementations, computing logic for the file importing functions of identifier 120 are integrated with client system 102. For example, file 204 can be stored on a file server of client system 102 and the interpreter module 110 can use the integrated importer function to retrieve the file 204. Interpreter module 110 can be configured to support a variety of file retrieval methods, such as a file attachment upload method or methods involving the file transfer protocol (FTP).

The server 104 can include an example management, instrumentation, and discovery (MID) server that is a Java-based application executed within an operating system of the server 104. For example, a MID server can facilitate communication and movement of data between the cloud computing platform 112 and other application programs (e.g., external applications), data sources, and services. The server 104 can use the MID server application features to execute code scripts (e.g., JavaScript) as well as create or import additional script libraries for implementing features of the interpreter module 110 and the framework 200.

In some implementations, an application file that communicates with the MID server is installed on the client system 102 to allow the MID server and/or the server 104 to access network resources (e.g., DXF drawing files) stored at the client system 102. The application file can be configured to facilitate streamlined access to the client system 102. For example, the application file can be used by the client system 102 to provision data access permissions to the MID server and the server 104. The permissions can facilitate direct access to data files and resources of the client system 102 irrespective of access restrictions imposed by firewalls or other network boundary devices of the client system.

To perform the framework 200, the interpreter module 110 receives the DXF file 204 (e.g., a drawing file) from client system 102. The file 204 includes multiple respective data sections that can represent layers or other aspects of a DXF drawing file. Individual layers of a drawing file correspond to physical features or other characteristics of real-world constructs, such as plumbing or electrical lines of a building. In addition to the layers, the file 204 can include various types of data that can represent real-world entities. Data representing a real-world entity can be described at least as a data record or a data object of the DXF drawing file. An example data object can represent a graphical data structure for depicting lines and boundaries that define physical features of real-world constructs.

The interpreter module 110 identifies each data section 206 of the DXF file 204. For example, based on features of the server 104 and/or the MID server, the interpreter module 110 uses the identifier 120 to perform data processing and streaming operations for identifying data sections 206 of file 204. In some implementations, data for the various data sections of file 204 are streamed to the compute blocks of the interpreter module 110 and processed in real-time. In other implementations, each compute block consumes an entire file 204 by storing the file in memory and then processing the file 204 to perform a particular operation for interpreting data contents of the file.

The interpreter module 110 parses and extracts objects and/or information 208 about real-world entities from the file layers that correspond to the identified data sections 206. As used herein, real-world entities represent actual physical and non-physical items/things of the real-world that can be graphically rendered and displayed at a computer system display monitor as a computer-generated object. Examples of a real-world entity include a layout of a floor of a building, a campus location, buildings at the campus, rooms of the building, a computing device positioned in a room, a detectable wireless signal range of the computing device, or plumbing lines of the building.

For clarity, data representing real-world entities relates to electronic data for producing the computer-generated objects that can be graphically displayed at a display monitor of a computer system. Hence, data representing real-world entities is different than the actual physical (and non-physical) items that correspond to the real world entities. In some implementations, real-world entities can indicate signal coverage ranges, sprinkler system ranges, or physical attributes and dimensions of real-world construct.

For example, the information 208 about real-world entities extracted from the file layers can: i) define an outline of the real-world entity, e.g., size or shape of the entity, or ii) is descriptive of the real-world entity, e.g., indicates a Wi-Fi signal range or identifies a type of electrical line.

The DXF file 204 can define multiple layers that each include information about features of a digitally renderable real-world entity (e.g., a geographic structure or location). In some implementations, each layer includes data that defines a virtual boundary of the feature of the digitally rendered real-world entity. For example, a layer can correspond to a physical building, a floorplan, or campus location floorplan, and the feature can correspond to a shape of at least a portion of the particular real-world entities for that layer.

The interpreter module 110 uses the data extractor 122 to parse data for a layer and forms sets of individual entity records based on the parsed data. Using the sets of individual entity records, the data extractor 122 extracts dimensional coordinates and/or descriptive information 210 for the real-world entity. For example, each entity record can correspond to a shape or feature of the real-world entity and can include dimensional coordinates that define an outline and other characteristics of the real-world entity. Extracted dimensional coordinates 210 can define the lines and boundaries of a real-world entity.

The interpreter module 110 uses the converter 124 to convert the extracted dimensional coordinates 210 to a GeoJSON file format 212. For example, the converter 124 processes raw numerical line data, e.g., for the dimensional coordinates 210, in the native DXF file format to generate new GeoJSON data structures. The generated GeoJSON data 212 includes geometry or physical attribute information about real-world entities of the DXF file 204. The interpreter module 110 uses the data translator 126 to translate and digitally render geographic structures 214 using the GeoJSON data 212 that are based the converted dimensional coordinates 210. As used in this document, translating and rendering relates to using extracted DXF file coordinates 210 that have been converted to the GeoJSON file format 212 to reconstruct (e.g., render) a particular shape or outline of a real-world entity. The data translator 126 renders a digital geographic structure 214 by aggregating converted dimensional coordinates 210 that have the geospatial data format 212. A digital geographic structure depicts a real-world entity (or multiple real-world entities) and is computer-generated for graphical rendering and display using a computer system. The aggregated dimensional coordinates 210 represent rendered geographic data structures 214 and are used to generate GeoJSON file 218.

The interpreter module 110 can communicate with the EAM system 116 that manages assets for at least one location hierarchy 220. The EAM system 116 uses the GeoJSON file 218 to obtain entity meta data about the real-world entities represented by data in the DXF file 204. For example, the entity meta data can include descriptions of physical assets associated with a real-world entity or space profile information indicating a size or dimension of a real-world entity, such as a size of room in a building.

The EAM system 116 can modify existing representations, or create new representations, of real-world entities and buildings using the entity metadata included in the GeoJSON file 218. In some implementations, the EAM system 116 uses a mapping module 222 of the system 100 to associate assets managed by the enterprise system with features of a real-world entity represented in the DXF file 204. For example, the module 222 can associate the assets of a location hierarchy 220 with real-world entities based on a relationship between the assets and the real world entities.

For example, the mapping module 222 can be a data processor (e.g., a software module that processes data) that uses programed instructions to scan an existing asset database for information about assets (e.g., real-entities) of a location hierarchy 220. The module 222 can also analyze information about real-world entities identified in the file 218. Based on the scanning and analysis, the module 222 can determine relationships between the assets of the database and the real-world entities included in the file 218. For example, a relationship between the asset and the real-world entity can be defined based on the asset and the entity associated with the same virtual floorplan or layer of the location hierarchy 220. In some implementations, the location hierarchy 220 includes existing feature locations and floor plan details of the multiple real-world entities that are identified and included in file geoJSON file 218.

Figure 3:
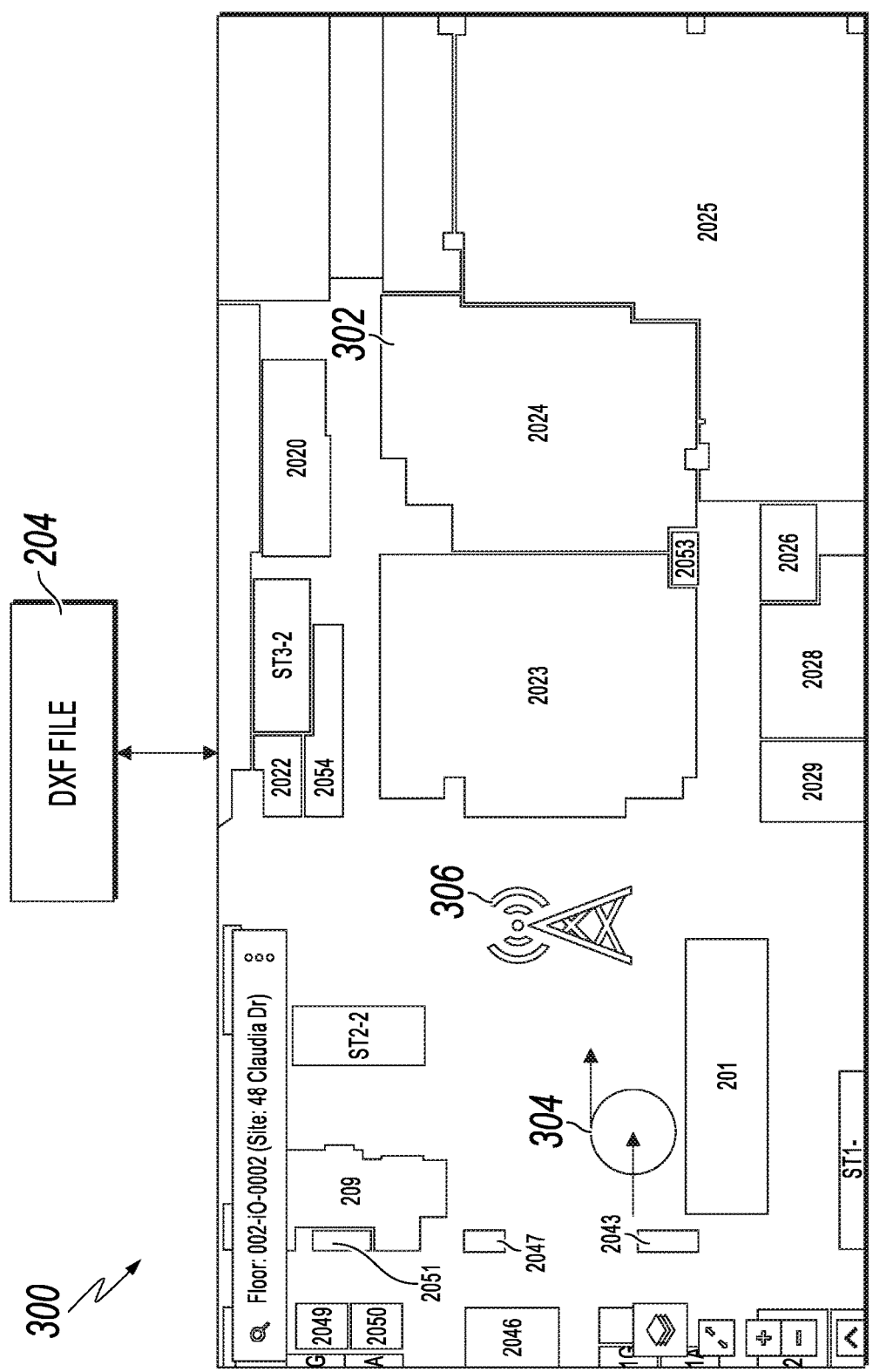
FIG. 3 illustrates an example floorplan represented by a DXF file.

FIG. 3 illustrates a diagram 300 of real-world entities that can be represented by the DXF file 204. The diagram 300 can include data representations of real-world entities for at least a floorplan layer of the DXF file 204. For example, the data representations can be two dimensional renderings of floorplans for a building, where the floorplans include different outlines 302 for each room of a floor in the building. Data representations of other real-world entities associated with a layer of the file 204 include an example Wi-FI or cellular signal coverage range 306 and/or a plumbing fixture 304 (e.g., a pump).

Figure 4:
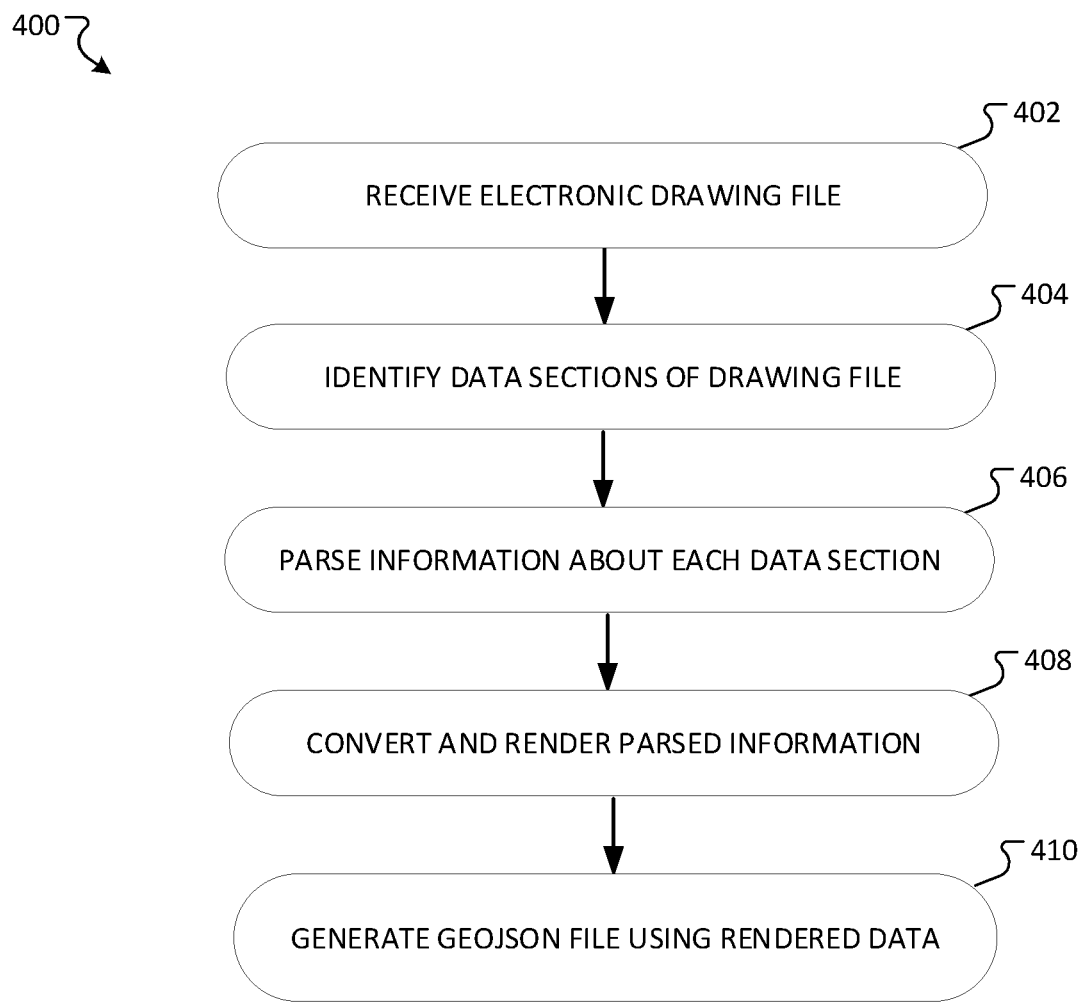
FIG. 4 is a process flow chart for executing an interpreter framework to convert one or more files.

FIG. 4 is a flow chart of a process 400 for executing an interpreter framework to convert one or more files. The process 400 can be performed or executed using systems 100 and 200 described above. In some implementations, described actions of process 400 are enabled by programmed software instructions that are executable by at least one processing device and memory of computing systems described in this document.

The process 400 includes the interpreter module 110 of the system 100 receiving a first electronic data file (402). For example, the interpreter module 110 can import or receive a DXF drawing file that includes multiple respective data sections. The respective data sections can represent layers of a DXF drawing file. In some implementations, individual layers of a drawing file correspond to physical features or other characteristics of real-world constructs. For example, one layer can correspond to plumbing lines and related plumbing features of a real-world building construct or electrical lines and wiring features included in the building construct.

The interpreter module 110 uses the identifier 120 to identify each of the respective data sections of the first electronic data file 108, e.g., the DXF drawing file (404). Each data section or layer of the drawing file includes data representing a real-world entity of the drawing file. In some implementations, real-world entities can include Wi-Fi zones of a building or location, sprinkler range for a sprinkler system of a building, or various other entities and attributes of one or more real-world construct. In some implementations, data representing a real-world entity can be described as one or more data objects of the DXF drawing file, such as graphical structures for depicting lines and boundaries. The lines and boundaries may define a floorplan of the real-world building construct or physical items associated with the floorplan.

For each of the respective data sections or layers of the DXF drawing file, the interpreter module 110 uses the data extractor 122 to parse information about the real-world entities represented by the data for the layer (406). In some implementations, parsing the information about the real-world entity includes data extractor 122 extracting dimensional coordinates for the real-world entity. The dimensional coordinates define characteristics of the real-world entity. For example, extracted dimensional coordinates can define the lines and boundaries for a floorplan of the real-world building construct and/or define the lines and boundaries for physical items associated with the floorplan.

The interpreter module 110 uses the converter 124 to convert the extracted dimensional coordinates (408) to a geospatial data format, e.g., a GeoJSON file format. In some implementations, converting the extracted dimensional coordinates to the GeoJSON file format includes the module 110 generating at least one dataset that includes geometry or physical attribute information about one or more real-world entities represented by data in the drawing file. In response to extracting and converting the dimensional coordinates to the GeoJSON file format, the module 110 can use the data translator 126 to translate and digitally render at least one geographic structure using the dimensional coordinates (408).

For example, the interpreter module 110 can translate and digitally render the digital geographic structure by aggregating converted dimensional coordinates that have the geospatial data format. The aggregated dimensional coordinates can represent rendered data for generating a geospatial data file, e.g., a GeoJSON file. The interpreter module 110 then generates a second electronic data file 128 based on the rendered data associated with each of the respective data sections of the DXF drawing file (410). The second electronic file 128 is a GeoJSON data file that encodes data for rendering digital geographic structures using information about the real-world entity represented by the data for the respective layers of the drawing file. In some implementations, the digital geographic structures represent physical or other features of the real-world building constructs.

Figure 5:
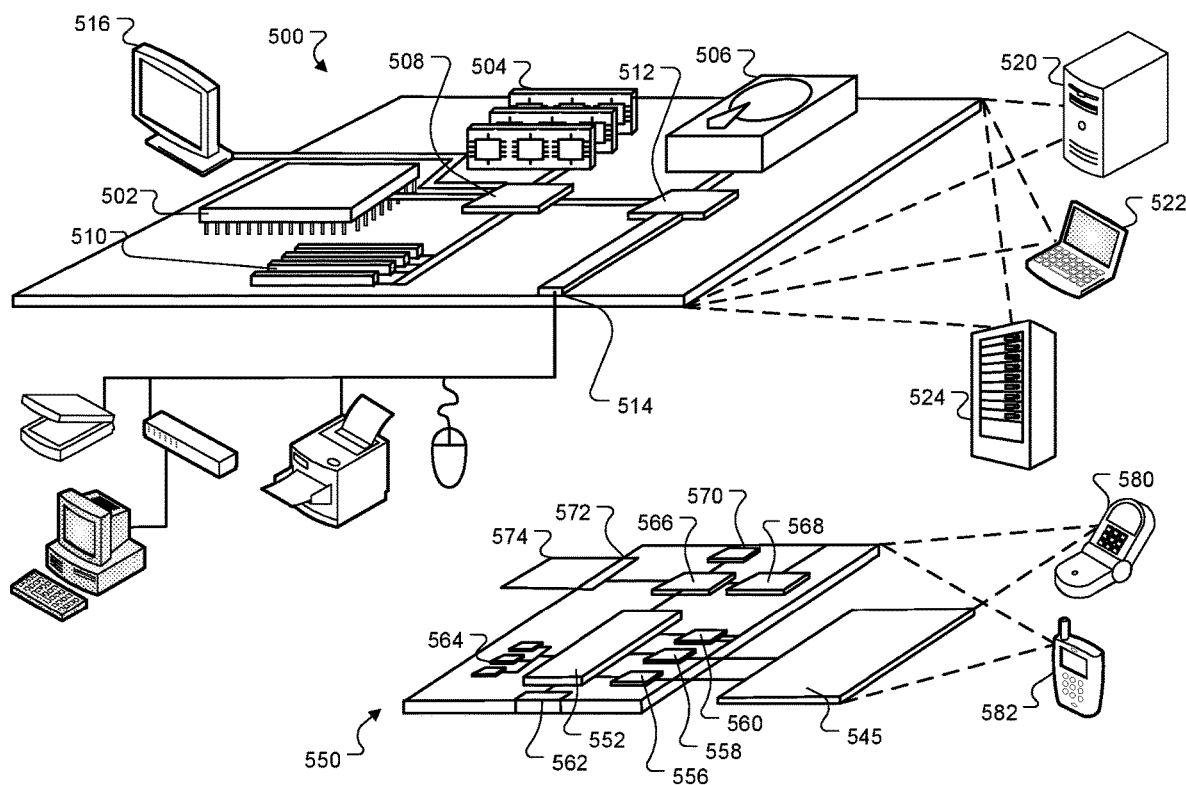
FIG. 5 is a block diagram of a computing system that can be used in connection with methods described in this specification.

FIG. 5 is a block diagram of computing devices 500, 550 that may be used to implement the systems and methods described in this document, as either a client or as a server or plurality of servers. Computing device 500 is intended to represent various forms of digital computers, such as laptops, desktops, workstations, personal digital assistants, servers, blade servers, mainframes, and other appropriate computers. Computing device 550 is intended to represent various forms of mobile devices, such as personal digital assistants, cellular telephones, smartphones, smartwatches, head-worn devices, and other similar computing devices. The components shown here, their connections and relationships, and their functions, are meant to be exemplary only, and are not meant to limit implementations described and/or claimed in this document.

Computing device 500 includes a processor 502, memory 504, a storage device 506, a high-speed interface 508 connecting to memory 504 and high-speed expansion ports 510, and a low speed interface 512 connecting to low speed bus 514 and storage device 506. Each of the components 502, 504, 506, 508, 510, and 512, are interconnected using various busses, and may be mounted on a common motherboard or in other manners as appropriate. The processor 502 can process instructions for execution within the computing device 500, including instructions stored in the memory 504 or on the storage device 506 to display graphical information for a GUI on an external input/output device, such as display 516 coupled to high speed interface 508. In other implementations, multiple processors and/or multiple buses may be used, as appropriate, along with multiple memories and types of memory. Also, multiple computing devices 500 may be connected, with each device providing portions of the necessary operations, e.g., as a server bank, a group of blade servers, or a multi-processor system.

The memory 504 stores information within the computing device 500. In one implementation, the memory 504 is a computer-readable medium. In one implementation, the memory 504 is a volatile memory unit or units. In another implementation, the memory 504 is a non-volatile memory unit or units.

The storage device 506 is capable of providing mass storage for the computing device 500. In one implementation, the storage device 506 is a computer-readable medium. In various different implementations, the storage device 506 may be a floppy disk device, a hard disk device, an optical disk device, or a tape device, a flash memory or other similar solid state memory device, or an array of devices, including devices in a storage area network or other configurations. In one implementation, a computer program product is tangibly embodied in an information carrier. The computer program product contains instructions that, when executed, perform one or more methods, such as those described above. The information carrier is a computer- or machine-readable medium, such as the memory 504, the storage device 506, or memory on processor 502.

The high speed controller 508 manages bandwidth-intensive operations for the computing device 500, while the low speed controller 512 manages lower bandwidth-intensive operations. Such allocation of duties is exemplary only. In one implementation, the high-speed controller 508 is coupled to memory 504, display 516, e.g., through a graphics processor or accelerator, and to high-speed expansion ports 510, which may accept various expansion cards (not shown). In the implementation, low-speed controller 512 is coupled to storage device 506 and low-speed expansion port 514. The low-speed expansion port, which may include various communication ports, e.g., USB, Bluetooth, Ethernet, wireless Ethernet, may be coupled to one or more input/output devices, such as a keyboard, a pointing device, a scanner, or a networking device such as a switch or router, e.g., through a network adapter.

The computing device 500 may be implemented in a number of different forms, as shown in the figure. For example, it may be implemented as a standard server 520, or multiple times in a group of such servers. It may also be implemented as part of a rack server system 524. In addition, it may be implemented in a personal computer such as a laptop computer 522. Alternatively, components from computing device 500 may be combined with other components in a mobile device (not shown), such as device 550. Each of such devices may contain one or more of computing device 500, 550, and an entire system may be made up of multiple computing devices 500, 550 communicating with each other.

Computing device 550 includes a processor 552, memory 564, an input/output device such as a display 554, a communication interface 566, and a transceiver 568, among other components. The device 550 may also be provided with a storage device, such as a microdrive or other device, to provide additional storage. Each of the components 550, 552, 564, 554, 566, and 568, are interconnected using various buses, and several of the components may be mounted on a common motherboard or in other manners as appropriate.

The processor 552 can process instructions for execution within the computing device 550, including instructions stored in the memory 564. The processor may also include separate analog and digital processors. The processor may provide, for example, for coordination of the other components of the device 550, such as control of user interfaces, applications run by device 550, and wireless communication by device 550.

Processor 552 may communicate with a user through control interface 558 and display interface 556 coupled to a display 554. The display 554 may be, for example, a TFT LCD display or an OLED display, or other appropriate display technology. The display interface 556 may include appropriate circuitry for driving the display 554 to present graphical and other information to a user. The control interface 558 may receive commands from a user and convert them for submission to the processor 552. In addition, an external interface 562 may be provided in communication with processor 552, so as to enable near area communication of device 550 with other devices. External interface 562 may provide, for example, for wired communication, e.g., via a docking procedure, or for wireless communication, e.g., via Bluetooth or other such technologies.

The memory 564 stores information within the computing device 550. In one implementation, the memory 564 is a computer-readable medium. In one implementation, the memory 564 is a volatile memory unit or units. In another implementation, the memory 564 is a non-volatile memory unit or units. Expansion memory 574 may also be provided and connected to device 550 through expansion interface 572, which may include, for example, a SIMM card interface. Such expansion memory 574 may provide extra storage space for device 550, or may also store applications or other information for device 550. Specifically, expansion memory 574 may include instructions to carry out or supplement the processes described above, and may include secure information also. Thus, for example, expansion memory 574 may be provided as a security module for device 550, and may be programmed with instructions that permit secure use of device 550. In addition, secure applications may be provided via the SIMM cards, along with additional information, such as placing identifying information on the SIMM card in a non-hackable manner.

The memory may include for example, flash memory and/or MRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 564, expansion memory 574, or memory on processor 552.

Device 550 may communicate wirelessly through communication interface 566, which may include digital signal processing circuitry where necessary. Communication interface 566 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 568. In addition, short-range communication may occur, such as using a Bluetooth, WiFi, or other such transceiver (not shown). In addition, GPS receiver module 570 may provide additional wireless data to device 550, which may be used as appropriate by applications running on device 550.

Device 550 may also communicate audibly using audio codec 560, which may receive spoken information from a user and convert it to usable digital information. Audio codec 560 may likewise generate audible sound for a user, such as through a speaker, e.g., in a handset of device 550. Such sound may include sound from voice telephone calls, may include recorded sound, e.g., voice messages, music files, etc., and may also include sound generated by applications operating on device 550.

The computing device 550 may be implemented in a number of different forms, as shown in the figure. For example, it may be implemented as a cellular telephone 580. It may also be implemented as part of a smartphone 582, a personal digital assistant, or other similar mobile device.

Various implementations of the systems and techniques described here can be realized in digital electronic circuitry, integrated circuitry, specially designed ASICs, computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs, also known as programs, software, software applications or code, include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device, e.g., magnetic discs, optical disks, memory, Programmable Logic Devices (PLDs) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

The systems and techniques described here can be implemented in a computing system that includes a back-end component, e.g., as a data server, or that includes a middleware component such as an application server, or that includes a front-end component such as a client computer having a graphical user interface or a Web browser through which a user can interact with an implementation of the systems and techniques described here, or any combination of such back-end, middleware, or front-end components. The components of the system can be interconnected by any form or medium of digital data communication such as, a communication network. Examples of communication networks include a local area network ("LAN"), a wide area network ("WAN"), and the Internet.

The computing system can include clients and servers. A client and server are generally remote from each other and typically interact through a communication network. The relationship of client and server arises by virtue of computer programs running on the respective computers and having a client-server relationship to each other.

As used in this specification, the term "module" is intended to include, but is not limited to, one or more computers configured to execute one or more software programs that include program code that causes a processing unit(s)/device(s) of the computer to execute one or more functions. The term "computer" is intended to include any data processing or computing devices/systems, such as a desktop computer, a laptop computer, a mainframe computer, a personal digital assistant, a server, a handheld device, a smartphone, a tablet computer, an electronic reader, or any other electronic device able to process data.

A number of embodiments have been described. Nevertheless, it will be understood that various modifications may be made without departing from the spirit and scope of the invention. Accordingly, other embodiments are within the scope of the following claims. While this specification contains many specific implementation details, these should not be construed as limitations on the scope of what may be claimed, but rather as descriptions of features that may be specific to particular embodiments. Certain features that are described in this specification in the context of separate embodiments can also be implemented in combination in a single embodiment.

Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, some processes depicted in the accompanying figures do not necessarily require the particular order shown, or sequential order, to achieve desirable results.

The invention claimed is:

1. A method implemented using a system comprising an interpreter module configured to execute an interpreter framework for generating geospatial data files, the method comprising:
   obtaining a drawing file comprising a plurality of layers, each of the plurality of layers comprising data values used to digitally render physical items;
   interpreting data values of a first layer of the drawing file, comprising:

extracting each data value that represents a dimensional coordinate of an entity record that corresponds to a physical item of the first layer;

for each data value that represents the dimensional coordinate, converting the data value to a geospatial file format to obtain a set of geospatial values; and automatically interpreting the data values irrespective of a manner in which data structures, that use the data values to define representations of physical items of the first layer, are arranged within the drawing file, wherein the drawing file is a drawing exchange format (DXF) file; and generating, based on the set of geospatial values, a geospatial data file having the geospatial file format, wherein the geospatial data file is configured to digitally render the physical item using the set of geospatial values, wherein the geospatial data file comprises a geospatial JavaScript Object Notation (geoJSON) drawing file configured to graphically render a floorplan of the DXF file, and wherein the physical item is included in the floorplan of the DXF file.

2. The method of claim 1, further comprising;
interpreting the data values of each of the plurality of layers in the drawing file, comprising:
for each layer:
extracting each data value that represents a dimensional coordinate of an entity record that corresponds to each physical item of the layer; and converting each of the extracted data values to the geospatial file format to obtain a respective set of geospatial values for the layer.

3. The method of claim 2, wherein generating the geospatial data file having the geospatial file format comprises:
generating the geospatial data file based on the respective set of geospatial values for each of the plurality of layers of the drawing file.

4. The method of claim 1, wherein the interpreter framework executed by the interpreter module is a computer-based file conversion process that enables different arrangements of data representations in the first drawing file to be automatically converted and rendered for viewing in a geoJSON format.

5. The method of claim 1, wherein generating the geospatial data file comprises:
converting dimensional coordinates of the first layer to the geospatial file format; aggregating each of the converted dimensional coordinates that have the geospatial file format; and
generating the set of geospatial values based on the converted dimensional coordinates that have the geospatial file format.

6. The method of claim 5, wherein the geospatial file format is a geospatial data interchange format that is based on JavaScript Object Notation (JSON) and the geospatial file format is for representing geographical features of the drawing file, along with a respective non-spatial attribute of each geographical feature.

7. The method of claim 1, further comprising:
automatically processing, using the interpreter module, contents of the drawing file after storing the drawing file in a memory, wherein the interpreter module processes the first drawing file independent of the application interface used to generate the first drawing file.

8. A system that comprises an interpreter module configured to execute an interpreter framework for generating geospatial data files, the system comprising a processing device and a non-transitory machine-readable storage device storing instructions that are executable by the processing device to cause performance of operations comprising:
obtaining a drawing file comprising a plurality of layers, each of the plurality of layers comprising data values used to digitally render physical items;
interpreting data values of a first layer of the drawing file, comprising:
extracting each data value that represents a dimensional coordinate of an entity record that corresponds to a physical item of the first layer;
for each data value that represents the dimensional coordinate, converting the data value to a geospatial file format to obtain a set of geospatial values; and
automatically interpreting the data values irrespective of a manner in which data structures, that use the data values to define representations of physical items of the first layer, are arranged within the drawing file, wherein the drawing file is a drawing exchange format (DXF) file; and
generating, based on the set of geospatial values, a geospatial data file having the geospatial file format, wherein the geospatial data file is configured to digitally render the physical item using the set of geospatial values, wherein generating the geospatial data file comprises a geospatial JavaScript Object Notation (geoJSON) drawing file configured to graphically render a floorplan of the DXF file, and wherein the physical item is included in the floorplan of the DXF file.

9. The system of claim 8, wherein the operations further comprise:
interpreting the data values of each of the plurality of layers in the drawing file, comprising:
for each layer:
extracting each data value that represents a dimensional coordinate of an entity record that corresponds to each physical item of the layer; and
converting each of the extracted data values to the geospatial file format to obtain a respective set of geospatial values for the layer.

10. The system of claim 9, wherein generating the geospatial data file having the geospatial file format comprises:
generating the geospatial data file based on the respective set of geospatial values for each of the plurality of layers of the drawing file.

11. The system of claim 8, wherein the interpreter framework executed by the interpreter module is a computer-based file conversion process that enables different arrangements of data representations in the first drawing file to be automatically converted and rendered for viewing in a geoJSON format.

12. The system of claim 8, wherein generating the geospatial data file comprises:
converting dimensional coordinates of the first layer to the geospatial file format; aggregating each of the converted dimensional coordinates that have the geospatial file format; and
generating the set of geospatial values based on the converted dimensional coordinates that have the geospatial file format.

13. The system of claim 12, wherein the geospatial file format is a geospatial data interchange format that is based on JavaScript Object Notation (JSON) and the geospatial file format is for representing geographical features of the drawing file, along with a respective non-spatial attribute of each geographical feature.

14. A non-transitory machine-readable storage device storing instructions for generating geospatial data files using an interpreter module, the instructions being executable by a processing device to cause operations comprising:
 obtaining a drawing file comprising a plurality of layers, each of the plurality of layers comprising data values used to digitally render physical items;
 interpreting data values of a first layer of the drawing file, comprising:
  extracting each data value that represents a dimensional coordinate of an entity record that corresponds to a physical item of the first layer;
  for each data value that represents the dimensional coordinate, converting the data value to a geospatial file format to obtain a set of geospatial values; and
  automatically interpreting the data values irrespective of a manner in which data structures, that use the data values to define representations of physical items of the first layer, are arranged within the drawing file, wherein the drawing file is a drawing exchange format (DXF) file; and
 generating, based on the set of geospatial values, a geospatial data file having the geospatial file format, wherein the geospatial data file is configured to digitally render the physical item using the set of geospatial values, wherein generating the geospatial data file comprises a geospatial JavaScript Object Notation (geoJSON) drawing file configured to graphically render a floorplan of the DXF file, and wherein the physical item is included in the floorplan of the DXF file.

15. The non-transitory machine-readable storage device of claim 14, wherein the operations further comprise:
 interpreting data values of each of the plurality of layers in the drawing file, comprising:
  for each layer:
   extracting each data value that represents a dimensional coordinate of an entity record that corresponds to each physical item of the layer; and
   converting each of the extracted data values to the geospatial file format to obtain a respective set of geospatial values for the layer.

16. The non-transitory machine-readable storage device of claim 15, wherein generating the geospatial data file having the geospatial file format comprises:
 generating the geospatial data file based on the respective set of geospatial values for each of the plurality of layers of the drawing file.

17. The non-transitory machine-readable storage device of claim 14, wherein the interpreter framework executed by the interpreter module is a computer-based file conversion process that enables different arrangements of data representations in the first drawing file to be automatically converted and rendered for viewing in a geoJSON format.

18. The non-transitory machine-readable storage device of claim 14, wherein generating the geospatial data file comprises:
 converting dimensional coordinates of the first layer to the geospatial file format; aggregating each of the converted dimensional coordinates that have the geospatial file format; and
 generating the set of geospatial values based on the converted dimensional coordinates that have the geospatial file format.

19. The non-transitory machine-readable storage device of claim 18, wherein the geospatial file format is a geospatial data interchange format that is based on JavaScript Object Notation (JSON) and the geospatial file format is for representing geographical features of the drawing file, along with a respective non-spatial attribute of each geographical feature.

* * * * *